United States Patent [19]

Mossman et al.

[11] 4,283,655

[45] Aug. 11, 1981

[54] CATHODE RAY TUBE WITH MULTIPLE INTERNAL GRATICULES

[75] Inventors: Ralph A. Mossman, Portland; Kenneth R. Stinger, Hillsboro, both of Oreg.

[73] Assignee: Tektronix, Inc., Beaverton, Oreg.

[21] Appl. No.: 88,488

[22] Filed: Oct. 26, 1979

[51] Int. Cl.³ ........................ H01J 29/34; G01R 13/20

[52] U.S. Cl. .................................... 313/462; 324/115; 324/121 R

[58] Field of Search ............... 313/462, 474, 475, 478; 324/115, 121 R; 358/350

[56] References Cited

U.S. PATENT DOCUMENTS

| | | | |
|---|---|---|---|
| 3,274,421 | 9/1966 | Johnson | 313/462 |
| 3,683,225 | 8/1972 | Butler | 313/462 |

*Primary Examiner*—Ernest F. Karlsen

*Attorney, Agent, or Firm*—John D. Winkelman

[57] ABSTRACT

A cathode-ray tube for a multipurpose test and measurement or information display instrument is provided with multiple internal graticules. One of the graticules is permanently visible and functional at all times the instrument is in operation. Another of the graticules is formed in a manner such that it is not easily visible in normal ambient lighting conditions alone, but becomes plainly visible when edge lighted by suitable means.

7 Claims, 3 Drawing Figures

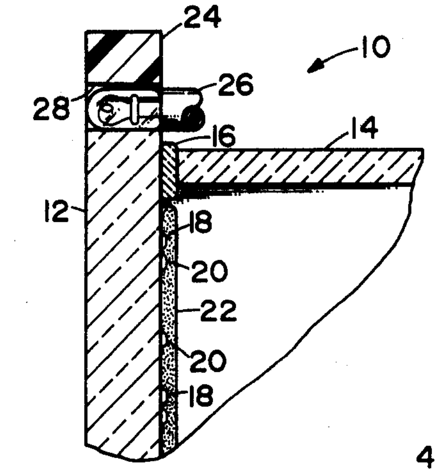
Fig. 1
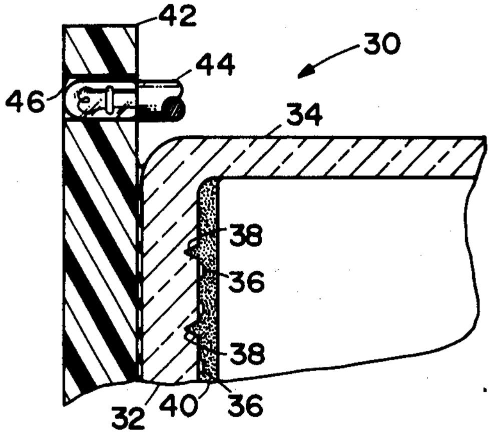
Fig. 2
Fig. 3
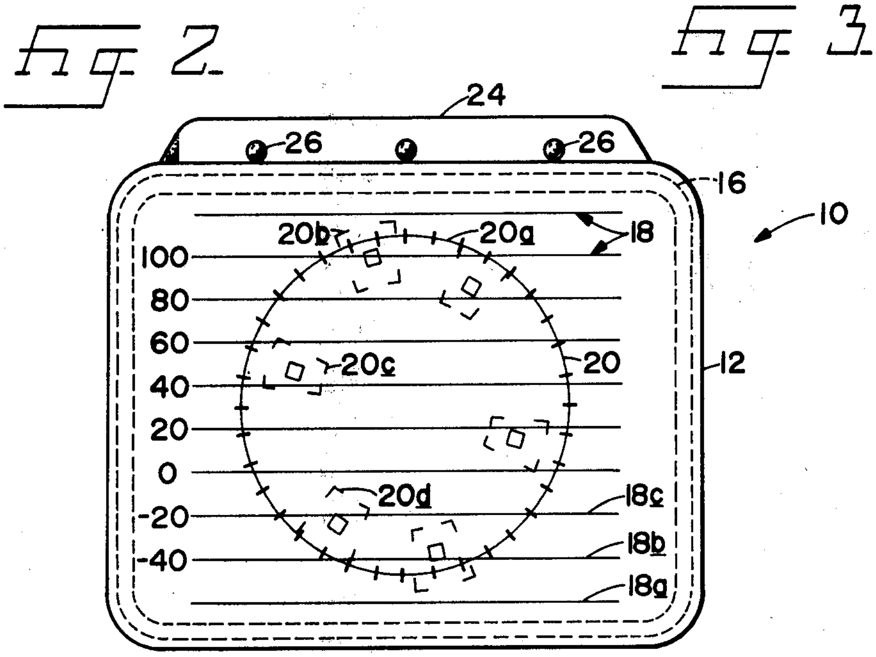

CATHODE RAY TUBE WITH MULTIPLE INTERNAL GRATICULES

BACKGROUND AND OBJECTS OF THE INVENTION

The present invention relates generally to cathode-ray tube (CRT) graticules, and more particularly to a CRT incorporating multiple internal graticules, only one of which is visible in normal ambient light.

As is well known, oscilloscope cathode-ray tubes are normally provided with a reference scale, or graticule, for making quantitative measurements. The graticule may for example, be engraved or printed on a transparent plastic plate mounted in front of the CRT's faceplate. Such "external" graticules are spaced at least the thickness of the faceplate from the tube's phosphorescent image display screen, making measurements susceptible to parallax error. For that reason, it is preferable to form the graticule on the inner surface of the faceplate so that the scale is in the same plane as the phosphorescent screen.

A principal drawback of such "internal" graticules is that they cannot be changed. This is a significant problem in certain special purpose oscilloscopes, such as those used to measure television signals. Television signals are quite complex, and a variety of different measurements must be made to characterize them completely. For example, conventional waveform displays are used to determine signal amplitude, bandwidth, linearity and distortion, signal-to-noise ratio, differential gain and signal component crosstalk. Vector presentations are employed to measure phase-related signal characteristics, such as chrominance phase and amplitude and to determine color errors arising during color encoding, video tape recording or signal transmission. Frequency response errors, phase response errors and the existence of nonlinear errors can be revealed by transient waveform analysis using pulse test signals.

It will be understood that several different scales are needed to make these measurements efficiently and conveniently. In an instrument using external graticules, the scales can be provided on individual transparent plates for selective mounting in front of the CRT screen. However, as already mentioned, external graticules are undesirable because of the parallax problem. A single internal graticule combining the various measurement scales would have a cluttered, difficult-to-use and error-phone pattern. An alternative approach disclosed in Japanese Utility Model Publication No. 7058/73 is the use of a combination of internal and external graticules. The external graticule is mounted on the faceplate at all times, and is edge-lighted selectively (as is the internal graticule) when needed. In this arrangement, however, measurements are parallax error-free only when the internal graticule is in use. An additional drawback is that a relatively cumbersome mechanical arrangement is needed for mounting the external graticule and two edge-lighting lamp assembles.

A general object of the present invention is to provide an improved multiple graticule construction that is free from the drawbacks of the above-described alternatives.

Another, related object is to provide a cathode-ray tube that incorporates multiple internal graticules.

A more specific object is to provide a CRT having at least two internal graticules, only one of which is easily visible in normal ambient light.

A still more specific object is to provide a CRT that includes two internal graticules, one of which is always visible and the other of which is readily visible only when edge lighted.

Additional objects, features and advantages of the present invention will become apparent as the following detailed description is read in conjunction with the accompanying drawing.

BRIEF DESCRIPTION OF THE DRAWINGS

FIG. 1 is a fragmentary cross-sectional side view of a CRT incorporating a dual internal graticule according to a first embodiment of the present invention;

FIG. 2 is a front elevation view of the FIG. 1 CRT; and

FIG. 3 is a fragmentary cross-sectional side view of a CRT with a dual internal graticule according to a second embodiment of the invention.

DESCRIPTION OF PREFERRED EMBODIMENTS

Referring now to the drawings, portions of a cathode-ray tube 10 for a multipurpose measuring instrument are shown (in simplified form) in FIGS. 1 and 2. The instrument contemplated by this description is intended for the analysis and measurement of television signals, and is, in effect, a combination television waveform monitor and vectorscope. It will be understood, however, that the present invention is not restricted to use in such an instrument.

CRT 10 includes a transparent glass faceplate 12 secured to a ceramic funnel 14 by a glass frit seal 16 in the manner taught by U.S. Pat. No. 3,207,936 to Wilbanks et al. Formed on the inner face of faceplate 12 in a manner to be described are two graticule scales, a first scale 18 comprising a plurality of parallel horizontal lines ***18a*, *18b*, *18c*, etc. with associated numeric indicia, and a second scale 20 that includes a circle *20a* and six sets of brackets defining trapezoidal boxes *20b*, *20c*, *20d*, etc. Scale 18 is used to analyze or measure waveform displays. Vector (polar coordinate) displays are evaluated using circular scale 20**.

As shown in FIG. 1, graticule scales 18 and 20 are disposed beneath a phosphor layer 22 on the inner surface of faceplate 14. The phosphor layer may function as a conventional display screen, or it may also act as a storage dielectric if CRT 10 is a direct viewing storage tube of the type described, for example, in U.S. Pat. Nos. 3,292,473 to Anderson, 3,293,474 to Gibson, Jr., 3,401,293 to Morris, 3,531,675 to Frankland, 3,614,820 to Morris, and 3,978,366 to Steele. In such event, of course, a suitable collector structure (not shown) of a type described in the just-mentioned patents will also be provided. When the phosphor layer serves as a storage dielectric, it also functions a phosphorescent viewing screen to display a light image corresponding to any charge image stored thereon.

The majority of TV signal measurements are made using graticule scale 18, and for that reason it is formed so as to be permanently visible. Thus, for example, the various lines and figures comprising scale 18 may be screen printed on the inner surface of faceplate 14 using an "ink" of a color that contrasts with the color of phosphor layer 22. A suitable ink comprises a thixotropic suspension of a low melting point glass (appropriately colored) in an organic binder solution. After applying a pattern of the colored mixture to the faceplate using a stainless steel screen, the glass frit is fused to the inner surface by heating the faceplate in air to a temperature above the fusion point of the frit. U.S. Pat. No. 3,683,225 details the formation of an orange-reflective scale that is easily visible in bright room lighting. Black colored graticules also are suitable for use in CRT's with typical instrumentation phosphors, such as P31.

According to the present invention, graticule scale 20 is formed in a manner such that it is not easily viewable in normal ambient light conditions, but becomes plainly visible when edge lighted by suitable means. Scale 20 may, for example be screen printed on faceplate 14 using the procedure outlined above, the color of the fired-on glass frit being chosen to match the phosphor's color as closely as possible. By way of specific example, if layer 22 is of P31 phosphor, a color-matched ink may be prepared as follows:

(a) Weigh 84 grams of Drakenfeld No. 592 oil (21% by wt.) into a suitable container.

(b) Add 16 grams of Baker Castor Oil Co's. MPA-60 organic thixotrope (4% by wt.).

(c) While stirring, add 300 grams of low firing temperature glass color (75% by wt.), including:
100 grams No. 2316E (Ceramic Color & Chemical Co.)
20 grams No. 2473C (Ceramic Color & Chemical Co.).
180 grams No. X616 (Drakenfeld)

(d) Pass through a Kent three-roller ink mill three times to obtain a good dispension.

The glass colors should be classified for less than 20 microinch particle size, and preferably less than 10 microinch for fine scale lines (about 0.002" to 0.003"). The mixture has a drying time of about 15 minutes.

A screen-printed graticule 20 of the above composition substantially matches the color of P31 phosphor layer 22, so the circular pattern is not readily visible in the absence of light transmitted through the edge of faceplate 14. For selective illumination of graticule scale 20, CRT 10 is provided with edge lighting means including a light guide member 24 of glass or a suitable plastic material, disposed in contact with the upper edge of faceplate 14. A plurality of incandescent light bulbs 26 extend into apertures 28 formed in the guide member for transmitting light into the faceplate to illuminate the graticule scales. Light guide member 24 distributes the light from bulbs 26 uniformly along the faceplates upper edge. In accordance with usual practice, the bottom and side edges of faceplate 14 are provided with a light reflective coating (not shown) to distribute the light entering via the top edge. The degree of scale illumination is controlled by varying the amount of current supplied to light bulbs 26.

An alternative embodiment of the invention is illustrated in FIG. 3, wherein a CRT 30 of the type that includes a transparent glass faceplate 32 flame sealed to a glass funnel 34 is shown to include a pair of graticule scales 36, 38 on the inner face of the faceplate beneath a phosphor layer 40. Graticule scale 36 is permanently visible and may, for example, be formed in the same manner as scale 18 (FIGS. 1 and 2). In this embodiment, the second, selectively visible scale 38 is formed by etching or scribing the inner face of faceplate 32 to form a desired pattern of narrow grooves in the glass. Portions of phosphor layer 40 fill the grooves, making the graticule scale substantially invisible in the absence of edge lighting.

To edge light graticule scale 38 and thereby make it visible, a light guide member 42 in the form of a flat plate of transparent material is bonded to the outer surface of faceplate 32. The light guide member preferably is adhered to the faceplate by means of a transparent bonding agent, such as a silicone elastomer, having an index of refraction similar to that of the faceplate and guide member. The lines forming scale 38 are illuminated by light emitted from one or more light bulbs 44 inserted into apertures 46 in member 42. This and other suitable graticule edge-lighting techniques are described in U.S. Pat. Nos. 3,268,657 to Gibson, Jr. and 3,281,618 to Swedlund.

Obviously, numerous other modifications and variations of the present invention are possible in light of the above teachings. It is therefore to be understood that within the scope of the appended claims the invention may be practiced otherwise than as specifically described herein.

We claim as our invention:

1. In a cathode-ray tube having a transparent faceplate carrying a phosphor layer on its inner surface, means defining a first graticule scale formed beneath said phosphor layer and adjoining said inner surface, means defining a second graticule scale formed beneath said phosphor layer and adjoining said inner surface, and user controllable edge lighting means for directing light into said faceplate to illuminate said scales, one of said first and second scales being formed in a manner such that it is readily visible in the absence of illumination by said edge lighting means, the other of said scales being formed in a manner such that it is readily visable only when illuminated by said edge lighting means.

2. The cathode-ray tube of claim 1, wherein said one scale is formed of a material having a color that visually contrasts with the color of said phosphor layer, and the other scale is formed of a material having a color that substantially matches the color of said layer.

3. The cathode-ray tube of claim 2, wherein said graticule scales comprise patterns of glass frit material fused to said faceplate surface.

4. The cathode-ray tube of claim 1, wherein said first scale comprises a pattern of glass frit material fused to said faceplate surface, and said second scale comprises a pattern of grooves formed in said surface.

5. The cathode-ray tube of claim 4, wherein said first scale is of a frit material containing a colorant that contrasts with the color of said phosphor layer.

6. A cathode-ray tube for use in a multipurpose electronic instrument, said tube having a transparent faceplate carrying a phosphor layer on its inner surface, a first pattern of glass frit fused to said faceplate surface to define a first graticule scale beneath said phosphor layer, a second pattern of glass frit fused to said faceplate surface to define a second graticule scale beneath said phosphor layer, user controllable edge lighting means for directing light into said faceplate to illuminate said scales, the glass frit of said first pattern including a colorant different from the color of said phosphor layer, the glass frit of said second pattern including a colorant that substantially matches the color of said phosphor layer, whereby said first graticule scale is readily visible in the absence of illumination by said edge lighting means, and said second graticule scale is readily visible only when illuminated by said edge lighting means.

7. A cathode-ray tube for use in a multipurpose electronic instrument, said tube having a transparent faceplate carrying a phosphor layer on its inner surface, a pattern of glass frit fused to said faceplate surface and defining a first graticule scale beneath said phosphor layer, a pattern of grooves formed in said inner surface of the faceplate and defining a second graticule scale, and user controllable edge lighting means for directing light into said faceplate to illuminate said scales, said glass frit including a colorant that visually contrasts with the color of said phosphor layer, said grooves being filled with the phosphor material forming said phosphor layer, whereby said first graticule scale is readily visible in the absence of illumination by said edge lighting means, and said second graticule scale is readily visible only when illuminated by said edge lighting means.

* * * * *